(12) United States Patent
Lee et al.

(10) Patent No.: US 9,634,022 B2
(45) Date of Patent: Apr. 25, 2017

(54) THREE DIMENSIONAL SEMICONDUCTOR DEVICE

(71) Applicant: SK hynix Inc., Gyeonggi-do (KR)

(72) Inventors: Ki Hong Lee, Gyeonggi-do (KR); Seung Ho Pyi, Gyeonggi-do (KR); In Su Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 42 days.

(21) Appl. No.: 14/562,409

(22) Filed: Dec. 5, 2014

(65) Prior Publication Data

US 2016/0005747 A1    Jan. 7, 2016

(30) Foreign Application Priority Data

Jul. 2, 2014    (KR) .......................... 10-2014-0082455

(51) Int. Cl.

| | |
|---|---|
| *H01L 27/11514* | (2017.01) |
| *H01L 27/11568* | (2017.01) |
| *H01L 27/1157* | (2017.01) |
| *H01L 29/10* | (2006.01) |
| *H01L 29/792* | (2006.01) |
| *H01L 27/11582* | (2017.01) |

(52) U.S. Cl.
CPC .... *H01L 27/1157* (2013.01); *H01L 27/11582* (2013.01); *H01L 29/1037* (2013.01); *H01L 29/1054* (2013.01); *H01L 29/7926* (2013.01)

(58) Field of Classification Search
CPC ........... H01L 27/0688; H01L 27/11514; H01L 27/11568; H01L 27/1157; H01L 27/11582; H01L 29/1037; H01L 29/1054; H01L 29/7926
See application file for complete search history.

(56) References Cited

U.S. PATENT DOCUMENTS

| | | | | |
|---|---|---|---|---|
| 5,670,810 | A * | 9/1997 | Tamaki | ............ H01L 21/82385 257/331 |
| 5,831,276 | A * | 11/1998 | Gonzalez et al. | ................. 257/3 |
| 5,877,537 | A * | 3/1999 | Aoki | ............................ 257/390 |
| 6,352,887 | B1 * | 3/2002 | Hutter | ................. H01L 27/0623 257/E21.696 |
| 6,613,657 | B1 * | 9/2003 | Ngo et al. | ...................... 438/588 |
| 6,800,890 | B1 * | 10/2004 | Wohlfahrt et al. | ........... 257/295 |

(Continued)

FOREIGN PATENT DOCUMENTS

| | | |
|---|---|---|
| KR | 1020100106911 | 10/2010 |
| KR | 1020140037455 | 3/2014 |

*Primary Examiner* — Allen Parker
*Assistant Examiner* — Gustavo Ramallo
(74) *Attorney, Agent, or Firm* — IP & T Group LLP

(57) ABSTRACT

A semiconductor device includes alternately stacked conductive layers and the insulating layers, an opening passing through the conductive layers and insulating layers, a first semiconductor layer formed in the opening, a second semiconductor layer formed in the first semiconductor layer, a capping layer formed in the opening and disposed over the first semiconductor layer and the second semiconductor layer, and a liner layer interposed between the first semiconductor layer and the second semiconductor layer and protruding through the capping layer relative to the first semiconductor layer and the second semiconductor layer.

19 Claims, 12 Drawing Sheets

(56) References Cited

U.S. PATENT DOCUMENTS

| | | | |
|---|---|---|---|
| 6,831,310 B1* | 12/2004 | Mathew | H01L 27/108 |
| | | | 257/270 |
| 8,467,233 B2* | 6/2013 | Yu et al. | 365/156 |
| 2002/0008274 A1* | 1/2002 | Nakagawa | 257/314 |
| 2003/0173611 A1* | 9/2003 | Bertz | G01L 9/0098 |
| | | | 257/302 |
| 2005/0087785 A1* | 4/2005 | Lu | 257/295 |
| 2009/0008694 A1* | 1/2009 | Muemmler et al. | 257/306 |
| 2009/0236658 A1* | 9/2009 | Gruening-von Schwerin | 257/331 |
| 2010/0123202 A1* | 5/2010 | Hofmann | 257/401 |
| 2011/0024816 A1* | 2/2011 | Moon | H01L 27/11578 |
| | | | 257/314 |
| 2012/0003800 A1* | 1/2012 | Lee | H01L 27/11551 |
| | | | 438/261 |
| 2012/0032245 A1* | 2/2012 | Hwang et al. | 257/314 |
| 2012/0074368 A1* | 3/2012 | Sasago | H01L 27/0688 |
| | | | 257/2 |
| 2012/0126883 A1* | 5/2012 | Juengling | 327/581 |
| 2012/0282744 A1* | 11/2012 | Javorka et al. | 438/199 |
| 2013/0009229 A1* | 1/2013 | Lee et al. | 257/314 |
| 2013/0155771 A1* | 6/2013 | Kim | H01L 29/66833 |
| | | | 365/185.05 |
| 2013/0194869 A1* | 8/2013 | Choi et al. | 365/185.11 |

* cited by examiner

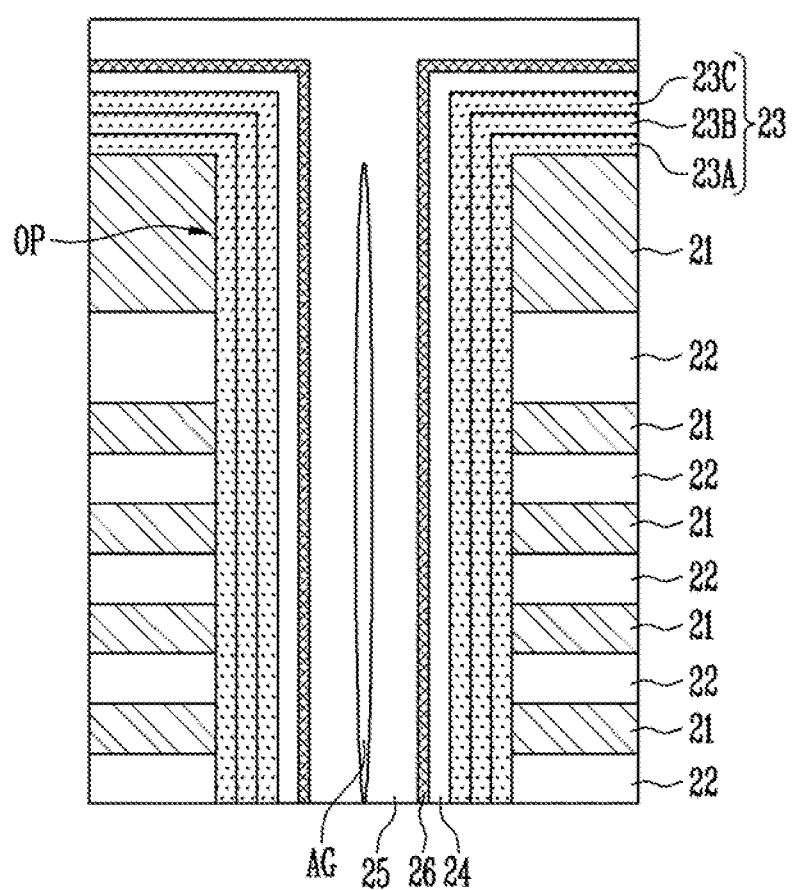

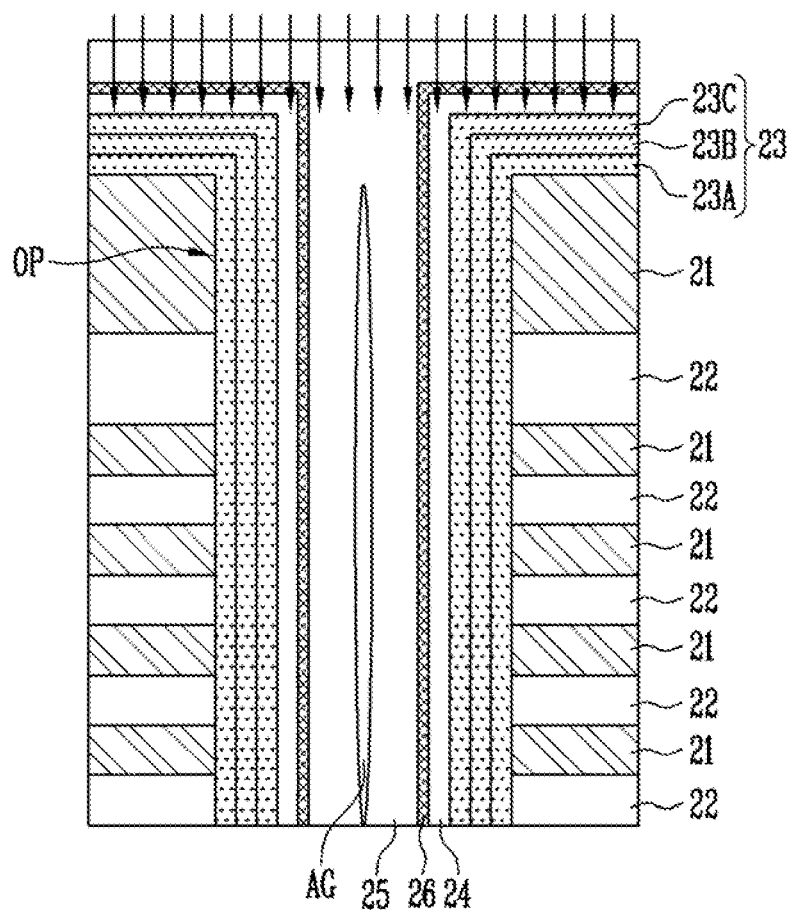

THREE DIMENSIONAL SEMICONDUCTOR DEVICE

CROSS-REFERENCE TO RELATED APPLICATION

The present application claims priority to Korean patent application number 10-2014-0082455, filed on Jul. 2, 2014, the entire disclosure of which is incorporated herein in its entirety by reference.

BACKGROUND

Field of Invention

The present invention relates to a semiconductor device and a method of manufacturing the same. More specifically, the present invention relates to a three-dimensional semiconductor device and a method of fabricating the same.

Description of Related Art

Nonvolatile memory devices are memory devices in which data stored therein is maintained even when its power supply is interrupted. Since the integration of two-dimensional nonvolatile memory devices having memory cells formed in a single layer on a substrate is reaching its physical limit, a three-dimensional nonvolatile memory device in which a plurality of memory cells are vertically stacked on a substrate has been proposed.

The three-dimensional memory device includes alternately stacked interlayer insulating layers and gate electrodes, and channel layers passing through the interlayer insulating layers and gate electrodes. In addition, memory cells and selection transistors may be stacked along the channel layers. Accordingly, to improve operation properties and reliability of the memory device, the selection transistors need to have uniform characteristics.

SUMMARY

The present invention is directed to a semiconductor device including transistors having uniform properties, and a method of manufacturing the same.

According to an embodiment of the present invention, a semiconductor device includes alternately stacked conductive layers and insulating layers, an opening passing through the conductive layers and insulating layers, a first semiconductor layer formed in the opening, a second semiconductor layer formed in the first semiconductor layer, a capping layer formed in the opening and disposed over the first semiconductor layer and the second semiconductor layer, and a liner layer interposed between the first semiconductor layer and the second semiconductor layer and protruding through the capping layer relative to the first semiconductor layer and the second semiconductor layer.

According to another embodiment of the present invention, a semiconductor device includes a first transistor having a first channel layer, a first dielectric layer surrounding the first channel layer, and a first gate electrode surrounding the first dielectric layer, a second transistor including a second channel layer formed on the first transistor, a second dielectric layer surrounding the second channel layer, a second gate electrode surrounding the second dielectric layer, and a liner layer passing through the first channel layer and the second channel layer.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which:

FIGS. 2A to 2D are cross-sectional views for describing a method of fabricating a semiconductor device according to an embodiment of the present invention;

DETAILED DESCRIPTION

Figure 1A:
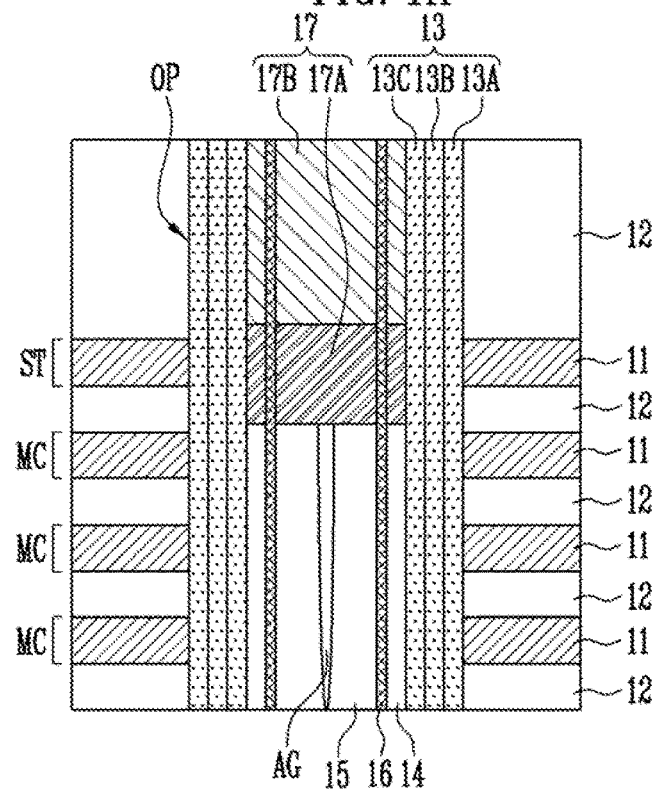
FIGS. 1A to 1C are cross-sectional views of structures of semiconductor devices according to embodiments of the present invention.

Various embodiments of the present invention will be described in detail below with reference to the accompanying drawings. The embodiments of the present invention may, however, be modified in different forms and should not be construed as limited to the embodiments set forth herein. In the drawings, the thicknesses of layers and regions may be exaggerated or omitted for clarity. Like numerals refer to like elements throughout the description of the figures.

Figure 1B:
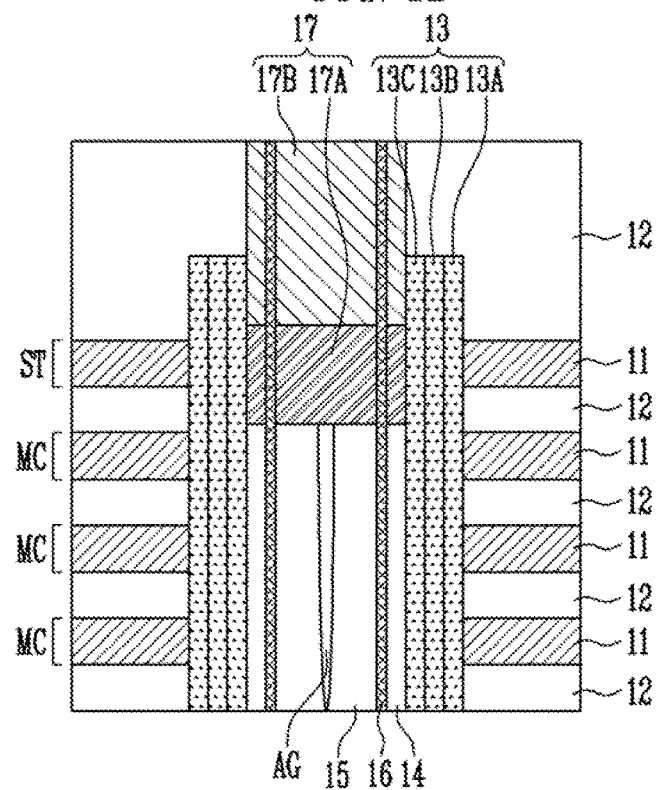
Figure 1C:
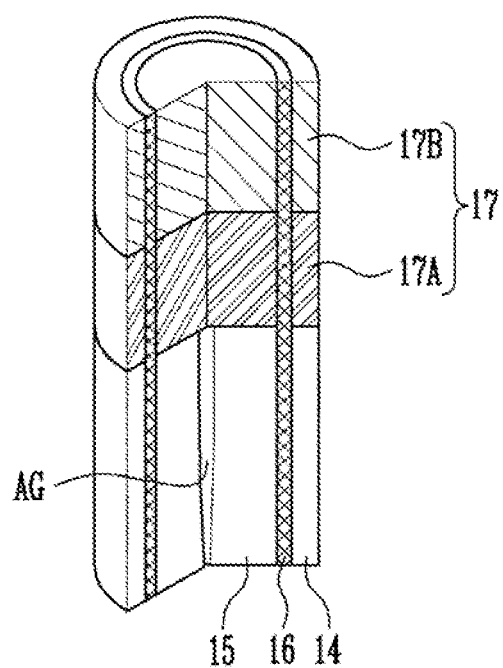

FIGS. 1A to 1C are cross-sectional views for describing structures of semiconductor devices according to embodiments of the present invention.

Referring to FIGS. 1A and 1B, a semiconductor device according to an embodiment of the present invention includes conductive layers 11, insulating layers 12, an opening OP, a dielectric layer 13, a first semiconductor layer 14, a second semiconductor layer 15, a liner layer 16, and a capping layer 17.

The conductive layers 11 and the insulating layers 12 are alternately stacked. The conductive layers 11 may be gate electrodes of a selection transistor, a memory cell, and the like, and the insulating layers 12 may insulate the stacked gate electrodes. The conductive layers 11 may include a polysilicon layer, a metal layer, or a barrier layer, and the insulating layers 12 may be oxide layers. Among the insulating layers 12, the uppermost insulating layer may have a thickness greater than the other insulating layers 12.

The opening OP may be formed to pass through the alternately stacked conductive layers 11 and insulating layers 12. A cross-section of the opening OP may have various shapes, such as a circular, elliptical, rectangular, or polygonal structure. In addition, the opening OP may have a uniform width from an upper portion to a lower portion, or be tapered downward.

The first semiconductor layer 14 may be formed in the opening OP. The first semiconductor layer 14 may be a channel layer of a selection transistor, a memory cell, etc. The first semiconductor layer 14 may have a uniform thickness along an inner wall of the opening OP or a downward tapering thickness. The second semiconductor layer 15 may be formed within the first semiconductor layer 14. The second semiconductor layer 15 may be a gap-filling layer that is within the opening OP. The second semiconductor layer 15 may include an air-gap AG. The air-gap AG may be a naturally formed empty space since the opening OP is not fully filled while the second semiconductor layer 15 is formed.

The first and second semiconductor layers 14 and 15 may be formed of a material having a melting point suitable for transitioning to a liquid phase by laser irradiation. The first and second semiconductor layers 14 and 15 may include silicon (Si), germanium (Ge), silicon germanium (SiGe), etc. In addition, the second semiconductor layer 15 may be formed of the same material as, or a different material from, the first semiconductor layer 14. For example, the first and second semiconductor layers 14 and 15 may be formed of an undoped silicon layer.

The liner layer 16 may be interposed between the first semiconductor layer 14 and the second semiconductor layer 15 and protrude through the capping layer 17 relative to the first and second semiconductor layers 14 and 15. The liner layer 16 may be a dielectric layer such as an oxide layer.

The capping layer 17 may be formed in the opening OP and located over the first and second semiconductor layers 14 and 15. The lower surface of the capping layer 17 may be positioned lower than the lower surface of the uppermost layer of the conductive layers 11. In addition, the capping layer 17 may include a junction 17B and a remaining portion 17A. The junction 17B may be a portion which has been uniformly doped with a high concentration of impurities, and the junction 17B may have a predetermined depth from an upper surface of the capping layer 17. The lower surface of the junction 17B may be located at a higher position than the upper surface of the uppermost conductive layer 11.

The dielectric layer 13 may be a gate insulating layer of a selection transistor or a memory layer of a memory cell. For example, the dielectric layer 13 may include a charge blocking layer 13A, a data storage layer 13B, and a tunnel insulating layer 13C. Additionally, the data storage layer 13B may include silicon, a nitride, a nano-dot, a phase-transition material etc. Referring to FIG. 1A, the dielectric layer 13 may be formed to surround the first semiconductor layer 14 and the capping layer 17. Referring to FIG. 1B, the dielectric layer 13 may be formed to surround the first semiconductor layer 14 and a portion of the capping layer 17. The dielectric layer 13 may have a height exposing most of the junction 17B while surrounding the remaining portion 17A and a portion of the junction 17B.

FIG. 1C illustrates a three-dimensional structure of the first semiconductor layer 14, the second semiconductor layer 15, the liner layer 16, and the capping layer 17. The liner layer 16 contacts an outer wall of the second semiconductor layer 15 and an inner wall of the first semiconductor layer 14, and passes through the capping layer 17. Thus, the capping layer 17 may be divided into a central portion located inside the liner layer 16 and a side portion located outside of the liner layer 16.

According to the above-described structure, a plurality of transistors stacked along a channel layer may be formed. At least one uppermost transistor may be a selection transistor ST, and the other transistors may be memory cells MC. Hereinafter, structures of the memory cells MC and the selection transistors ST will be described using the reference numerals of FIGS. 1A and 1B. However, the reference numerals of FIGS. 1A and 1B may be assigned a different name that corresponds to the memory cell and selection transistor structures. For example, each of the memory cells MC may include first channel layers 14 and 15, an air-gap AG within the first channel layers 14 and 15, a first dielectric layer 13 surrounding the first channel layers 14 and 15, and a first gate electrode 11 surrounding the first dielectric layer 13. The selection transistor ST may include a second channel layer 17, a second dielectric layer 13 surrounding the second channel layer 17, and a second gate electrode 11 surrounding the second dielectric layer 13. The second channel layer 17 of the selection transistor ST may fully fill the central portion of the opening OP.

In addition, the liner layer 16 may be formed to pass between the first channel layers 14 and 15 and through the second channel layer 17. Accordingly, the first channel layer 14 located outside of the liner layer 16 may serve substantially as a channel layer of a memory cell MC. In addition, a side portion of the second channel layer 17A, located outside of the liner layer 16, may serve substantially as a channel layer of the selection transistor ST, and a side portion of the second channel layer 17B, located outside of the liner layer 16, may serve substantially as a junction of the selection transistor ST.

FIGS. 2A to 2D are cross-sectional views for describing a method of fabricating a semiconductor device according to an embodiment of the present invention.

Referring to FIG. 2A, first material layers 21 and second material layers 22 are alternately formed. An uppermost first material layer 21 may be formed to be thicker than the other first material layers 21. In addition, the first material layers 21 may have the same thickness as or a different thickness from the second material layers 22.

The first material layers 21 may be layers for forming gate electrodes of a selection transistor, memory cells, etc., and the second material layers 22 may be layers for forming insulating layers electrically separating the stacked gate electrodes. Furthermore, the first material layers 21 may be formed of a material having a high etch selectivity with respect to the second material layers 22. As an example, the first material layers 21 may be formed of sacrificial layers including a nitride, and the second material layers 22 may be formed of insulating layers including an oxide. As another example, the first material layers 21 may be formed of conductive layers including doped polysilicon, doped amorphous silicon, etc., and the second material layers 22 may be formed of sacrificial layers including undoped polysilicon, undoped amorphous silicon, etc. In still another example, the first material layers 21 may be formed of conductive layers including doped polysilicon, doped amorphous silicon, etc., and the second material layers 22 may be formed of insulating layers such as an oxide. In this embodiment, the first material layers 21 are formed of sacrificial layers, and the second material layers 22 are formed of insulating layers.

Next, an opening OP passing through the first and second material layers 21 and 22 is formed, then a dielectric layer 23 may be formed along an inner surface of the opening OP. For example, a charge blocking layer 23A, a data storage layer 23B, and a tunnel insulating layer 23C are sequentially formed. The dielectric layer 23 may be formed not only in the opening OP but also over the uppermost first material layer 21.

Next, a first semiconductor layer 24, a liner layer 26, and a second semiconductor layer 25 may be formed on the dielectric layer 23. The second semiconductor layer 25 may fill the opening OP, and an air-gap AG may be formed in the second semiconductor layer 25.

Referring to FIG. 2B, an intermediate result having a first semiconductor layer 24, a liner layer 26, and a second semiconductor layer 25, is doped with impurities. For example, n-type impurities may be implanted by an ion implantation process.

Figure 2C:
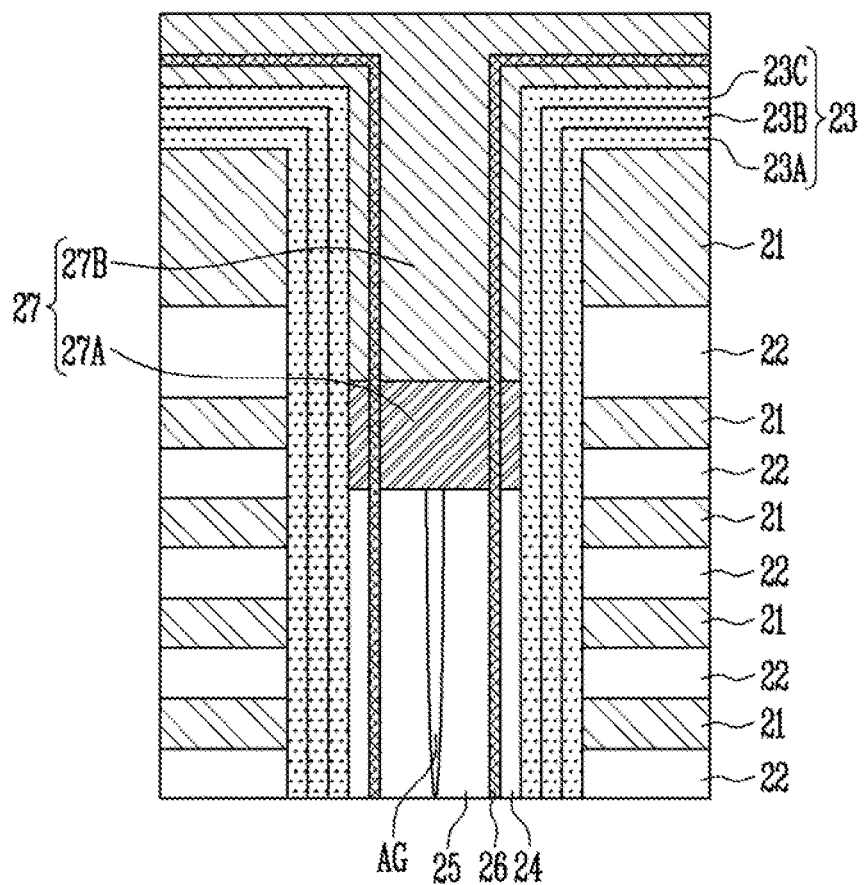

Referring to FIG. 2C, a capping layer 27 is formed by recrystallizing upper portions of the first semiconductor layer 24 and the second semiconductor layer 25 in a heat treatment process. For example, the upper portions of the first and second semiconductor layers 24 and 25 are melted and recrystallized with laser irradiation. The upper portions of the first semiconductor layer 24 and the second semiconductor layer 25 are transitioned into a liquid phase to fill the air-gap AG formed in the upper portion of the second semiconductor layer 25. Accordingly, the capping layer 27 may fully fill the upper part of the central portion. Since the depth of melted and recrystallized portions of the first and second semiconductor layers 24 and 25 is controlled by the amount and type of laser energy applied, the depth of the capping layer 27 may be controlled.

Additionally, since the impurities are diffused and redistributed by the energy of the laser, a junction 27B in which the impurities are uniformly distributed may be formed. Thus, as the energy of the laser increases, the doping impurities may have a deeper depth and a uniform concentration. Accordingly, the distribution and depth of the junction 27B may be controlled since the depth of the diffused doping impurities is controlled by adjusting the energy of the laser.

Figure 2D:
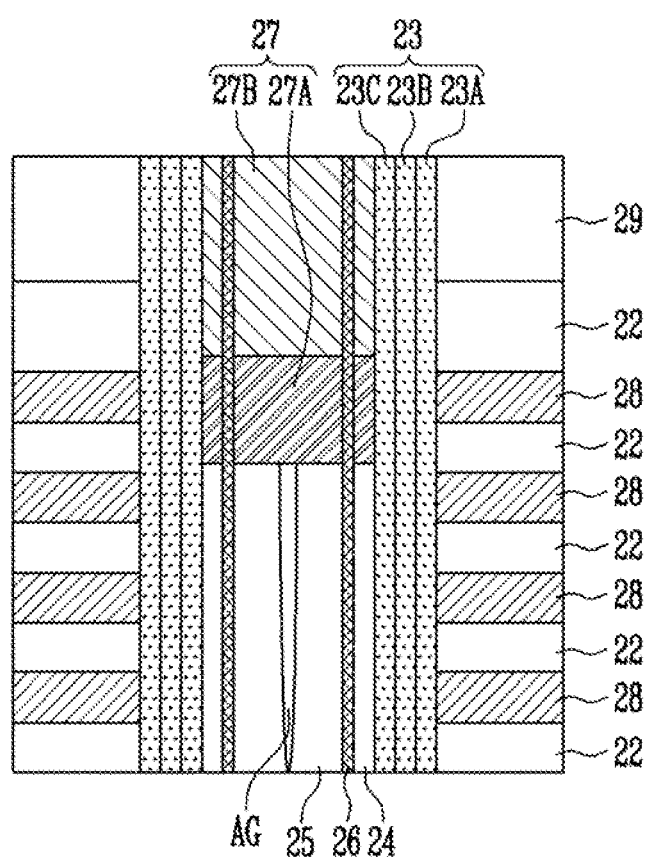

Referring to FIG. 2D, the first semiconductor layer 24, the liner layer 26, and the second semiconductor layer 25 are planarized until the uppermost first material layer 21 is exposed. For example, the first semiconductor layer 24, the liner layer 26, and the second semiconductor layer 25 may be planarized using a chemical mechanical polishing (CMP) process. Furthermore, the uppermost first material layer 21 may be used as a polishing stop layer. Thus, the capping layer 27 including the junction 27B and a remaining portion 27A may be formed.

Next, after the uppermost first material layer 21 is removed, an insulating layer 29 may be formed in a portion where the first material layer 21 was removed. For example, the insulating layer 29 may be an oxide layer. Next, a slit (not shown) passing through the insulating layer 29, the first material layers 21, and the second material layers 22 may be formed. The slit may be formed between neighbored openings OP. Next, the first material layers 21 exposed through the slit may be selectively removed, and conductive layers 28 may be formed where the first material layers 21 were removed. The conductive layers 28 may include tungsten (W), silicon (Si), tantalum (Ta), titanium (Ti), etc.

Although not shown in the drawing, an interlayer insulating layer may be formed on the insulating layer 29, then a contact hole passing through the interlayer insulating layer and exposing the capping layer 27 may be formed. Next, a contact plug may be formed in the contact hole. If an air-gap AG exists in the capping layer 27, a punching phenomenon, in which the contact hole passes through the capping layer 27, may occur. However, according to the embodiment of the present invention, since the capping layer 27 does not include the air-gap AG, the punching phenomenon may be prevented.

Depending on materials of the first and second material layers 21 and 22, the above-described manufacturing process may be partially changed. For example, when the first material layers 21 are conductive layers and the second material layers 22 are insulating layers, a process of siliciding the first material layers 21 through the slit may be performed and a process of replacing the first material layers 21 with the conductive layers 28 may be omitted. As another example, when the first material layers 21 are conductive layers and the second material layers 22 are sacrificial layers, the process of replacing the second material layers 22 with insulating layers may be performed and a process of replacing the first material layers 21 with the conductive layers 28 may be omitted.

FIGS. 3A to 3F are cross-sectional views for describing a method of fabricating a semiconductor device according to another embodiment of the present invention. Hereinafter, repeated descriptions of the above-described structure will be omitted.

Figure 3A:
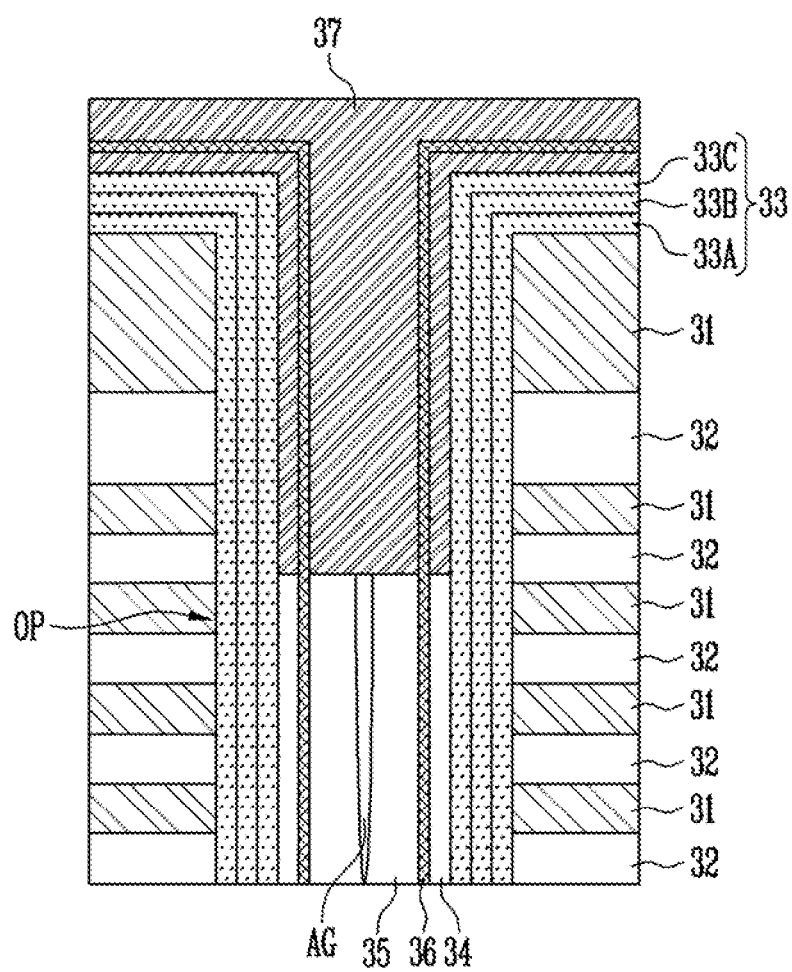
FIGS. 3A to 3F are cross-sectional views for describing a method of fabricating a semiconductor device according to an embodiment of the present invention.

Referring to FIG. 3A, first material layers 31 and second material layers 32 are alternately formed. Next, an opening OP passing through the first and second material layers 31 and 32 is formed, then a dielectric layer 33 is formed along an inner surface of the opening OP. The dielectric layer 33 may include a charge blocking layer 33A, a data storage layer 33B, and a tunnel insulating layer 33C.

A first semiconductor layer 34, a liner layer 36, and a second semiconductor layer 35 are formed on the dielectric layer 33, and then irradiated with a laser. Thus, upper portions of the first and second semiconductor layers 34 and 35 are melted and recrystallized to form a capping layer 37.

Figure 3B:
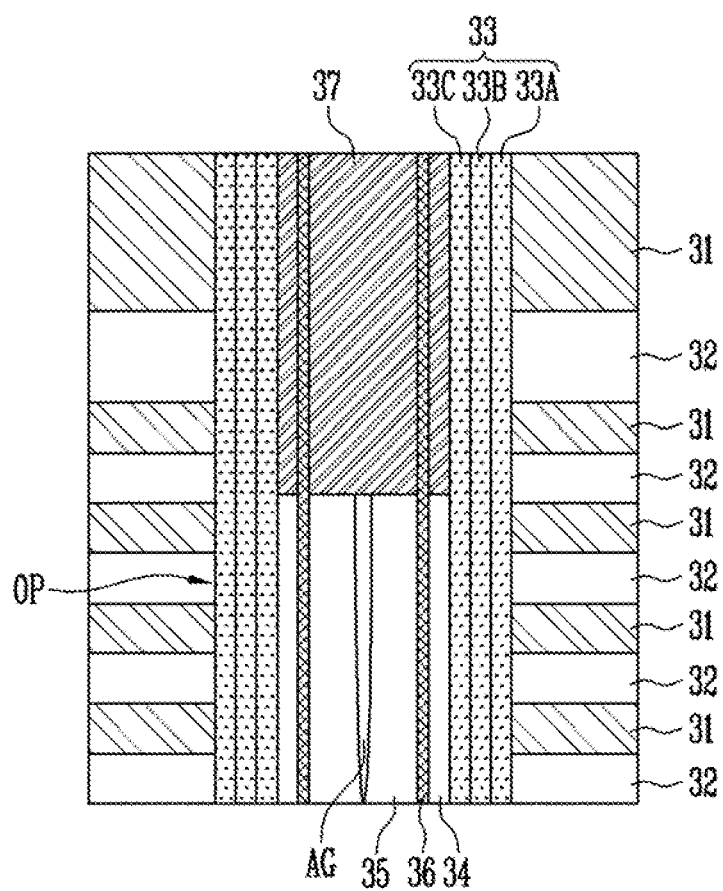

Referring to FIG. 3B, the first semiconductor layer 34, the liner layer 36, and the second semiconductor layer 35 are planarized until an uppermost first material layer 31 is exposed.

Figure 3C:
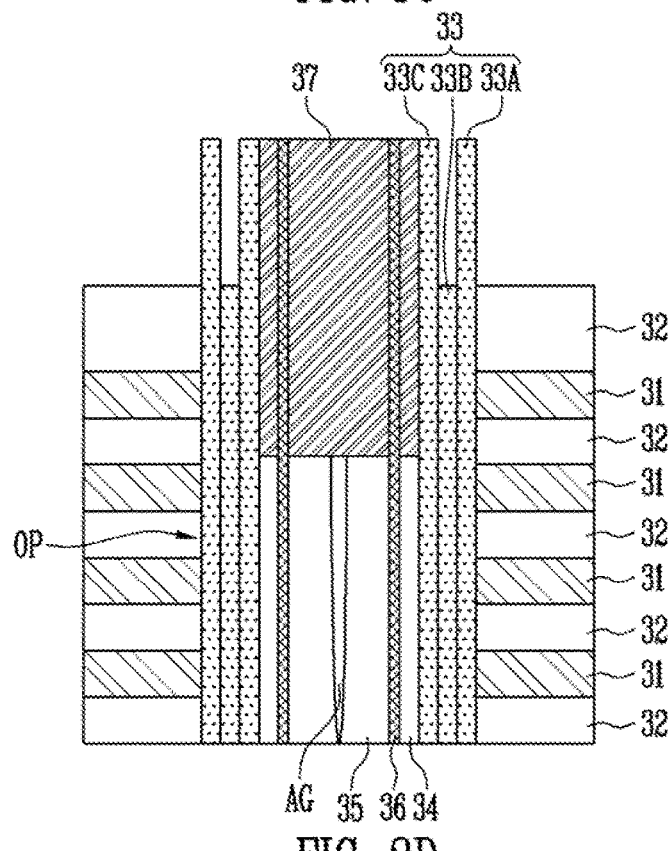

Referring to FIG. 3C, the uppermost first material layer 31 is removed. A portion of the dielectric layer 33 may also be removed. For example, a portion of the data storage layer 33B may be simultaneously removed with the uppermost first material 31, and the charge blocking layer 33A and the tunnel insulating layer 33C may be exposed.

Figure 3D:
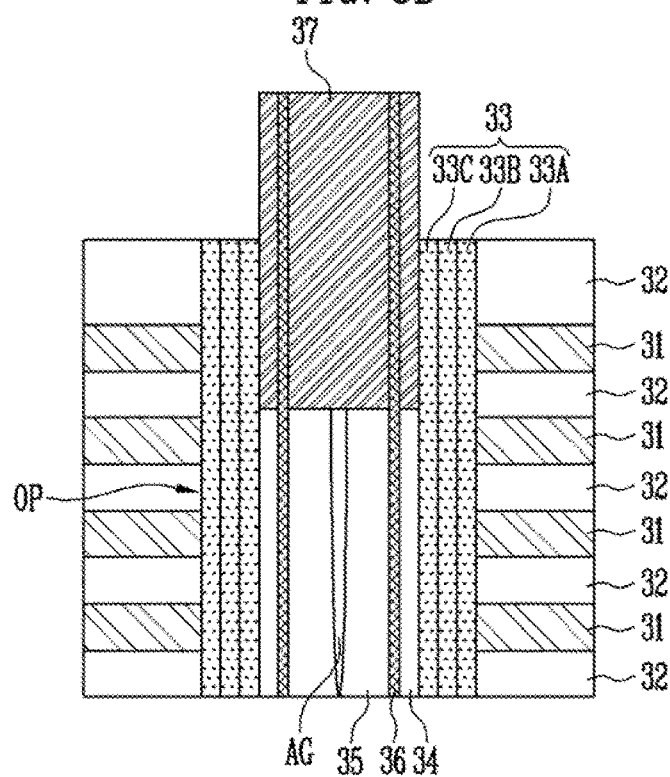

Referring to FIG. 3D, the charge blocking layer 33A and the tunnel insulating layer 33C, exposed by removal of the data storage layer 33B, are removed. Thus, an upper surface and an upper portion of a side wall of the capping layer 37 are exposed.

Figure 3E:
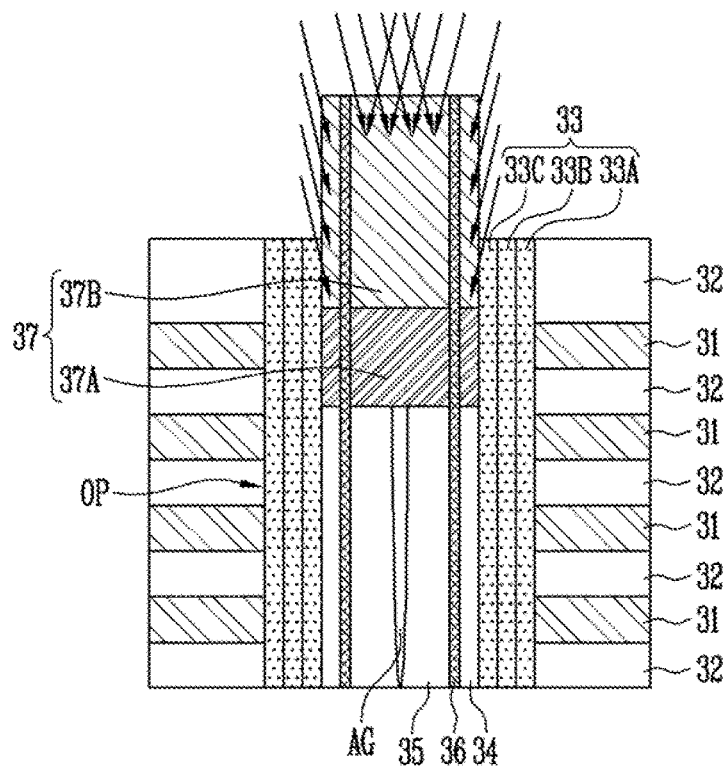

As illustrated in FIG. 3E, the upper portion of the capping layer 37 is doped with impurities. For example, the upper portion of the capping layer 37 is doped with impurities using a tilted ion implantation process or a plasma doping process. Thus, a junction 37B may be formed in the upper portion of the capping layer 37. For reference, the doping impurities may be diffused by a subsequent heat treatment process, thereby impurities may be uniformly distributed.

Figure 3F:
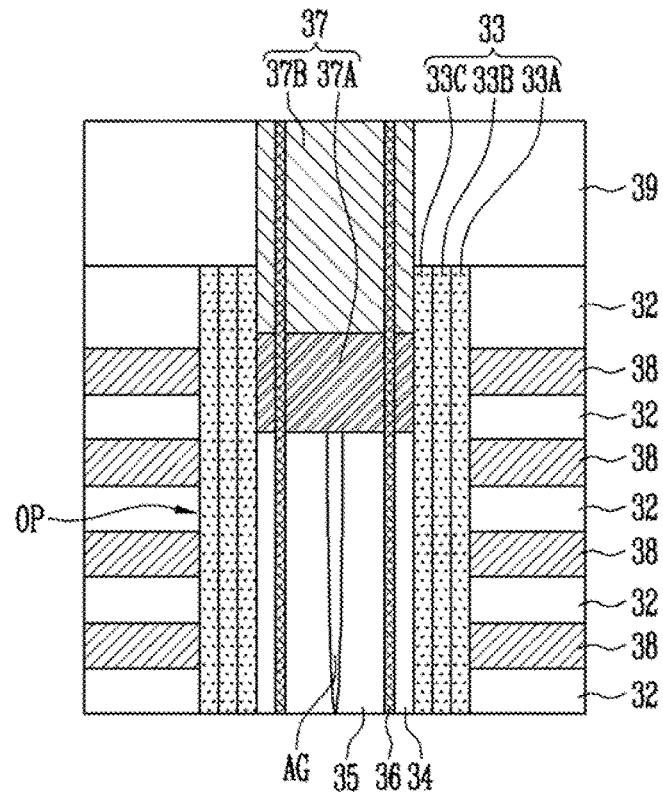

Referring to FIG. 3F, an insulating layer 39 is formed where the uppermost first material layer 31 was removed. Next, a slit (not shown) passing through the insulating layer 39, the first material layers 31, and the second material layers 32 is formed. The slit may be formed between neighbored openings OP. Next, the first material layers 31 exposed by the slit are selectively removed. Next, conductive layers 38 are formed where the first material layers 31 were removed. The conductive layers 28 may include tungsten (W), silicon (Si), tantalum (Ta), titanium (Ti), etc.

Figure 4:
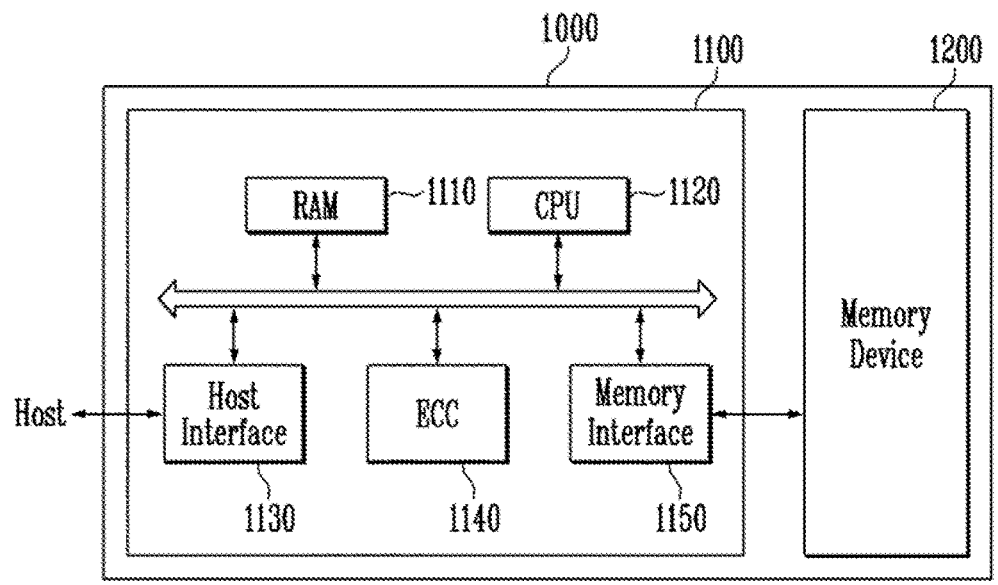
FIG. 4 is a block diagram illustrating a configuration of a memory system according to an embodiment of the present invention.

FIG. 4 is a block diagram illustrating a configuration of a memory system according to an embodiment of the present invention.

As illustrated in FIG. 4, a memory system 1000 according to an embodiment of the present invention may include a memory device 1200 and a controller 1100.

The memory device 1200 may store various types of data, such as text, graphics, and software codes. The memory device 1200 may be a nonvolatile memory device, and have a structure as described with reference to FIGS. 1A to 3F. In addition, the memory device 1200 may include alternately stacked conductive layers and insulating layers, an opening passing through the conductive layers and insulating layers, a first semiconductor layer formed within the opening, a second semiconductor layer formed on the first semiconductor layer, a capping layer formed on the first semiconductor layer and the second semiconductor layer in the opening, and a liner layer interposed between the first semiconductor layer and the second semiconductor layer and protruding relative to the first and second semiconductor layers to pass through the capping layer. Since the structure and manufacturing method of the memory device 1200 are the same as those in the above-described embodiment, detailed descriptions will be omitted.

The controller 1100 may be connected to a host and the memory device 1200 and configured to access the memory device 1200 in response to a request from the host. For example, the controller 1100 may be configured to control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may be used as an operational memory of the CPU 1120, a cache memory between the memory device 1200 and the host, or a buffer memory between the memory device 1200 and the host. For reference, the RAM 1110 may be replaced by a static random access memory (SRAM), a read only memory (ROM), etc.

The CPU 1120 may be configured to control the overall operation of the controller 1100. For example, the CPU 1120 may be configured to operate firmware such as a flash translation layer (FTL) stored in the RAM 1110.

The host interface 1130 may be configured to perform interfacing with the host. For example, the controller 1100 may communicate with the host through at least one of various interface protocols, such as a Universal Serial Bus (USB) protocol, a multimedia card (MMC) protocol, a peripheral component interconnection (PCI) protocol, a PCI-express (PCI-E) protocol, an advanced technology attachment (ATT) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The ECC circuit 1140 may be configured to detect errors included in data read from the memory device 1200 by using an ECC and may correct the errors.

The memory interface 1150 may be configured to perform interfacing with the memory device 1200. For example, the memory interface 1150 may include a NAND interface or a NOR interface.

For reference, the controller 1100 may further include a buffer memory (not shown) for temporarily storing data. The buffer memory may be used to temporarily store data externally through the host interface 1130 or data transmitted from the memory device 1200 through the memory interface 1150. In addition, the controller 1100 may further include a ROM storing code data for interfacing with the host.

Since the memory system 1000 according to this embodiment of the present invention includes a memory device 1200 having a high degree of integration and improved performance, the stability and degree of integration of the memory system 1000 may also be improved.

Figure 5:
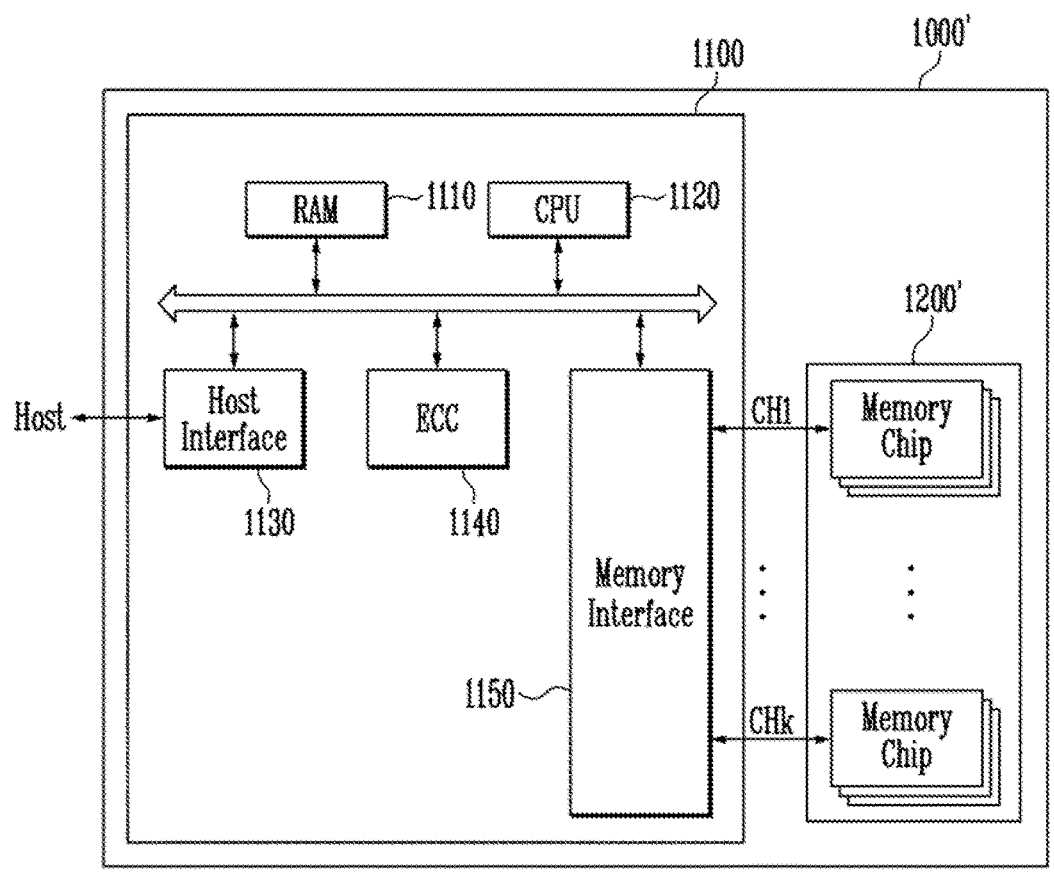
FIG. 5 is a block diagram illustrating a configuration of a memory system according to an embodiment of the present invention.

FIG. 5 is a block diagram illustrating a configuration of a memory system according to another embodiment of the present invention. Hereinafter, repeated descriptions of the above-described structure will be omitted.

As illustrated in FIG. 5, a memory system 1000' according to an embodiment of the present invention may include a memory device 1200' and a controller 1100. In addition, the controller 1100 may include a RAM 1110, a CPU 1120, a host interface 1130, an ECC circuit 1140, and a memory interface 1150.

The memory device 1200' may be a nonvolatile memory device, and include a memory string described with reference to FIGS. 1A to 3F. In addition, the memory device 1200' may include alternately stacked conductive layers and insulating layers, an opening passing through the conductive layers and insulating layers, a first semiconductor layer formed in the opening, a second semiconductor layer formed on the first semiconductor layer, a capping layer disposed on the first semiconductor layer and the second semiconductor layer in the opening, and a liner layer interposed between the first semiconductor layer and the second semiconductor layer and protruding through the capping layer relative to the first and second semiconductor layers. Since the structure and manufacturing method of the memory device 1200' is the same as the above-described, detailed descriptions will be omitted.

In addition, the memory device 1200' may be a multi-chip package consisting of a plurality of memory chips. The plurality of memory chips may be divided into a plurality of groups, the plurality of groups may be configured to communicate with the controller 1100 through first to $k^{th}$ channels CH1 to CHk. In addition, the memory chips belonging to a group may be configured to communicate with the controller 1100 through a common channel. For reference, the memory system 1000' may be modified in such a manner that one memory chip is connected to one channel.

Since the memory system 1000' according to this embodiment of the present invention includes a memory device 1200' having a high degree of integration and improved performance, the stability and the degree of integration of the memory system 1000' may also be improved. Particularly, since the memory device 1200' is formed as a multi-chip package, data storage capacity of the memory system 1000' may increase, and operating speed may be improved.

Figures 6, 7:
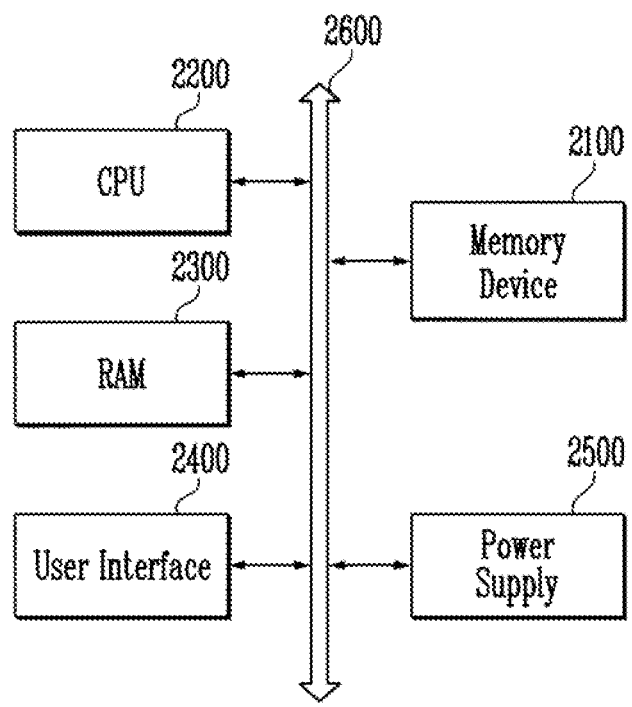
FIG. 6 is a block diagram illustrating a configuration of a computing system according to an embodiment of the present invention.
FIG. 7 is a block diagram illustrating a configuration of a computing system according to an embodiment of the present invention.

FIG. 6 is a block diagram illustrating a configuration of a computing system according to an embodiment of the present invention. Hereinafter, repeated descriptions will be omitted.

As illustrated in FIG. 6 a computing system 2000 according to an embodiment of the present invention may include a memory device 2100, a CPU 2200, a RAM 2300, a user interface 2400, a power supply 2500, and a system bus 2600.

The memory device 2100 may store data provided through the user interface 2400, data processed by the CPU 2200, etc. Additionally, the memory device 2100 may be electrically connected to the CPU 2200, the RAM 2300, the user interface 2400, and the power supply 2500 through the system bus 2600. For example, the memory device 2100 may be connected to the system bus 2600 through a controller (not shown), or be directly connected to the system bus 2600. When the memory device 2100 is directly connected to the system bus 2600, the CPU 2200, RAM 2300, etc. may function as the controller.

The memory device 2100 may be a nonvolatile memory device, and may include the memory string described with reference to FIGS. 1A to 3F. Furthermore, the memory device 2100 may include alternately stacked conductive layers and insulating layers, an opening passing through the conductive layers and insulating layers, a first semiconductor layer formed in the opening, a second semiconductor layer formed on the first semiconductor layer, a capping layer disposed on the first semiconductor layer and the second semiconductor layer in the opening, and a liner layer interposed between the first semiconductor layer and the second semiconductor layer and protruding through the capping layer relative to the first and second semiconductor layers. Since the structure and manufacturing method of the memory device 2100 is the same as that described above, detailed descriptions will be omitted.

In addition, the memory device 2100 may be a multi-chip package consisting of a plurality of memory chips, as described with reference to FIG. 5.

The computing system 2000 having such a configuration may be a computer, an ultra mobile PC (UMPC), a workstation, a net-book, a personal digital assistants (PDA), a portable computer, a web tablet, a wireless phone, a mobile phone, a smart phone, an e-book, portable multimedia player (PMP), a portable game machine, a navigation apparatus, a black box, a digital camera, a three-dimensional television, a digital audio recorder, a digital audio player, a digital picture recorder, a digital picture player, a digital video recorder, a digital video player, a device transmitting and receiving information in a wireless environment, one of a variety of electronic devices configuring a home network, one of a variety of electronic devices configuring a computer network, one of a variety of electronic devices configuring a telematics network, an RFID device etc.

Since the computing system 2000 according to this embodiment of the present invention includes a memory device 2100 having a high degree of integration and improved performance, stability and a data storage capacity of the computing system 2000 may increase.

FIG. 7 is a block diagram illustrating a computing system according to another embodiment of the present invention.

As illustrated in FIG. 7, a computing system 3000 according to an embodiment of the present invention may include a software layer including an operating system 3200, an application 3100, a file system 3300, and a translation layer 3400. In addition, the computing system 3000 may include a hardware layer such as a memory device 3500.

The operating system 3200 may be configured to manage software resources and hardware resources of the computing system 3000, and control program operations of a CPU. The application 3100 may be a variety of application programs executed in the computing system 3000, such as, a utility operated by the operating system 3200.

The file system 3300 may denote a logical structure for managing data and files existing in the computing system 3000, and organize data or files to be stored in the memory device 3500, etc. according to rules. The file system 3300 may be determined according to the operating system 3200 used in the computing system 3000. For example, when the operating system 3200 is a Windows product by Microsoft Corporation, the file system 3300 may be a file allocation table (FAT), an NT file system (NTFS), etc. Moreover, when the operating system 3200 is a UNIX/Linux product, the file system 3300 may be an extended file system (EFS), a UNIX file system (UFS), or a journaled file system (JFS), etc.

Although the operating system 3200, the application 3100, and the file system 3300 are illustrated as separate blocks in FIG. 7, the application 3100 and the file system 3300 may be included in the operating system 3200.

The translation layer 3400 may translate an address to a form suitable for the memory device 3500 in response to a request from the file system 3300. For example, the translation layer 3400 translates a logic address generated by the file system 3300 to a physical address of the memory device 3500. Mapping information of the logic address and physical address may be stored in an address translation table. For example, the translation layer 3400 may be a flash translation layer (FTL), a universal flash storage link layer (ULL), etc.

The memory device 3500 may be a nonvolatile memory device, and may include the memory string described with reference to FIGS. 1A to 3F. Additionally, the memory device 3500 may include alternately stacked conductive layers and insulating layers, an opening passing through the conductive layers and insulating layers, a first semiconductor layer formed in the opening, a second semiconductor layer formed on the first semiconductor layer, a capping layer formed on the first semiconductor layer and the second semiconductor layer in the opening, and a liner layer interposed between the first semiconductor layer and the second semiconductor layer and protruding through the capping layer relative to the first and second semiconductor layers. Since the structure and manufacturing method of the memory device 3500 is the same as that described above, detailed descriptions will be omitted.

The computing system 3000 having such a structure may be divided into an operating system layer performed at a high level region, and a controller layer performed at a low level region. The application 3100, the operating system 3200 and the file system 3300 may belong to the operating system layer and may be driven by an operational memory of the computing system 3000. In addition, the translation layer 3400 may belong to the operating system layer or the controller layer.

Since the computing system 3000 according to this embodiment of the present invention includes a memory device 3500 having a high degree of integration and improved performance, stability and a data storage capacity of the computing system 2000 may increase.

The embodiments of the present invention have transistors that include a junction with a uniform depth. Accordingly, transistors may have uniform properties, therefore, operating characteristics and reliability of semiconductor devices may be improved.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor device, comprising:
   alternately stacked conductive layers and insulating layers;
   an opening passing through the conductive layers and the insulating layers;
   a first semiconductor layer formed in the opening;
   a second semiconductor layer formed within the first semiconductor layer;
   a capping layer formed in the opening and disposed over the first semiconductor layer and the second semiconductor layer; and
   a liner layer interposed between the first semiconductor layer and the second semiconductor layer and extending above the first semiconductor layer and the second semiconductor layer so as to protrude through the capping layer.

2. The semiconductor device of claim 1, further comprising a dielectric layer formed in the opening and surrounding the first semiconductor layer and the capping layer.

3. The semiconductor device of claim 1, further comprising a dielectric layer formed in the opening and surrounding the first semiconductor layer and a portion of the capping layer.

4. The semiconductor device of claim 1, wherein the capping layer fully fills a central portion of the opening, and the second semiconductor layer includes an air-gap.

5. The semiconductor device of claim 1, wherein the first semiconductor layer is a channel layer, and the second semiconductor layer is a gap-filling layer.

6. The semiconductor device of claim 1, wherein the first and second semiconductor layers include undoped silicon.

7. The semiconductor device of claim 1, wherein the liner layer includes a dielectric material.

8. The semiconductor device of claim 1, wherein the capping layer includes a junction in which impurities are distributed in a substantially uniform manner.

9. The semiconductor device of claim 8, wherein a lower surface of the capping layer is located at a lower position than a lower surface of an uppermost conductive layer, among the conductive layers, and a lower surface of the junction is located at a higher position than an upper surface of the uppermost conductive layer.

10. A semiconductor device, comprising:
a first transistor including a first channel layer, a first dielectric layer surrounding the first channel layer, and a first gate electrode surrounding the first dielectric layer;
a second transistor stacked upon the first transistor and including a second channel layer, a second dielectric layer surrounding the second channel layer, and a second gate electrode surrounding the second dielectric layer;
a capping layer including a junction and stacked upon the second transistor; and
a liner layer passing through the first channel layer and the second channel layer in a stacking direction, wherein the liner layer extends above the second channel layer so as to protrude through the capping layer.

11. The semiconductor device of claim 10, wherein the first transistor is a memory cell, and the second transistor is a selection transistor.

12. The semiconductor device of claim 10, wherein the second channel layer fills a central portion of an opening, in which it is formed, and the first channel layer includes an air-gap.

13. The semiconductor device of claim 10, wherein the first channel layer and the second channel layer are coupled to each other.

14. The semiconductor device of claim 10, wherein the first channel layer passes through the first gate electrode so that the first gate electrode surrounds a side wall of the first channel layer.

15. The semiconductor device of claim 10, wherein the second channel layer passes through the second gate electrode so that the second gate electrode surrounds a side wall of the second channel layer.

16. The semiconductor device of claim 10, wherein a lower portion of the liner layer is formed within the first channel layer and an upper portion of the liner layer is formed within the second channel layer.

17. A semiconductor device, comprising:
alternately stacked gate electrodes and insulating layers;
a first channel layer including undoped silicon and passing through the gate electrodes and insulating layers;
a second channel layer including undoped silicon and passing through the gate electrodes and insulating layers, wherein the second channel layer is formed in the first channel layer; and
a liner layer including dielectric material and passing through the gate electrodes and insulating layers, wherein the liner layer is interposed between the first channel layer and the second channel layer and extends above the first channel layer and the second channel layer.

18. The semiconductor device of claim 17, further comprising:
a capping layer disposed over the first and second channel layers, wherein the liner layer protrudes into the capping layer.

19. The semiconductor device of claim 17, further comprising:
a first dielectric layer surrounding the first channel layer and including a first tunnel insulating layer, a first data storage layer and a first charge blocking layer; and
a second dielectric layer surrounding the first channel layer and including a second tunnel insulating layer, a second data storage layer and a second charge blocking layer.

* * * * *